United States Patent
Hara et al.

(10) Patent No.: US 8,699,018 B2
(45) Date of Patent: Apr. 15, 2014

(54) DEVICE INTERFACE APPARATUS AND TEST APPARATUS

(75) Inventors: Hideo Hara, Miyagi (JP); Shin Masuda, Miyagi (JP)

(73) Assignee: Advantest Corporation, Tokyo (JP)

( * ) Notice: Subject to any disclaimer, the term of this patent is extended or adjusted under 35 U.S.C. 154(b) by 100 days.

(21) Appl. No.: 13/196,866

(22) Filed: Aug. 2, 2011

(65) Prior Publication Data

US 2012/0033208 A1 Feb. 9, 2012

(30) Foreign Application Priority Data

Aug. 6, 2010 (JP) ................................. 2010-176973

(51) Int. Cl.
*G01N 21/01* (2006.01)
(52) U.S. Cl.
USPC ........................................................ 356/244
(58) Field of Classification Search
USPC ........................................................ 356/244
See application file for complete search history.

(56) References Cited

U.S. PATENT DOCUMENTS

2004/0027586 A1* 2/2004 Ichikawa et al. .............. 356/614

FOREIGN PATENT DOCUMENTS

| JP | H05-174926 A | 7/1993 |
| JP | H06-75003 A | 3/1994 |
| JP | H07-20357 A | 1/1995 |
| JP | H08-304453 A | 11/1996 |
| JP | 2002-90417 A | 3/2002 |
| JP | 101176024 A | 5/2008 |
| KR | 10-0295548 A | 8/2001 |
| TW | 200717054 A | 5/2007 |
| WO | 2007-013128 A1 | 2/2007 |

OTHER PUBLICATIONS

Notice of Office Action issued by the Korean Intellectual Property Office for appl No. 10-2011-0115178.
Notification of Reasons for Refusal of Japanese Patent Application No. 2010-176973, issued by the Japanese Patent Office on Sep. 10, 2013.
Office Action for Taiwanese Patent Application No. 100137875, issued by the Taiwanese Intellectual Property Office on Oct. 11, 2013.

* cited by examiner

*Primary Examiner* — Tarifur Chowdhury
*Assistant Examiner* — Abdullahi Nur

(57) ABSTRACT

It is an object of the present invention to test a device under test including an optical interface. Provided is a device interface apparatus on which is loaded a device under test including an optical interface. The device interface apparatus comprises a device loading section on which the device under test is loaded; an optical connector that is to be connected to the optical interface of the device under test; and an optical connector moving section that moves the optical connector toward the optical interface of the device under test loaded on the device loading section, to optically connect the optical connector and the optical interface.

18 Claims, 13 Drawing Sheets

DEVICE INTERFACE APPARATUS AND TEST APPARATUS

The contents of the following Japanese patent application are incorporated herein by reference:
NO. 2010-176973 filed on Aug. 6, 2010.

BACKGROUND

1. Technical Field

The present invention relates to a device interface apparatus and a test apparatus.

2. Related Art

Conventionally, a test apparatus is used to test a device under test such as a CPU or a memory. The device under test can be provided with an optical interface, as described in Patent Document 1, for example.

Patent Document 1: International Publication WO 2007-013128

When testing a module under test or a device under test having an optical interface, the test apparatus must establish an optical connection with the device under test, use an optical signal as the test signal input to the optical input section of the device under test, and detect an optical response signal output from the optical output section of the device under test. Furthermore, if the device under test includes an electrical signal interface for inputting and outputting electrical signals in addition to the optical interface, the test apparatus must establish an electrical connection as well as the optical connection with the device under test. It has been difficult for the test apparatus to realize an optical connection with a device under test having an optical interface.

SUMMARY

Therefore, it is an object of an aspect of the innovations herein to provide a device interface apparatus and a test apparatus, which are capable of overcoming the above drawbacks accompanying the related art. The above and other objects can be achieved by combinations described in the independent claims. According to a first aspect related to the innovations herein, provided is a device interface apparatus on which is loaded a device under test including an optical interface. The device interface apparatus comprises a device loading section on which the device under test is loaded; an optical connector that is to be connected to the optical interface of the device under test; and an optical connector moving section that moves the optical connector toward the optical interface of the device under test loaded on the device loading section, to optically connect the optical connector and the optical interface.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
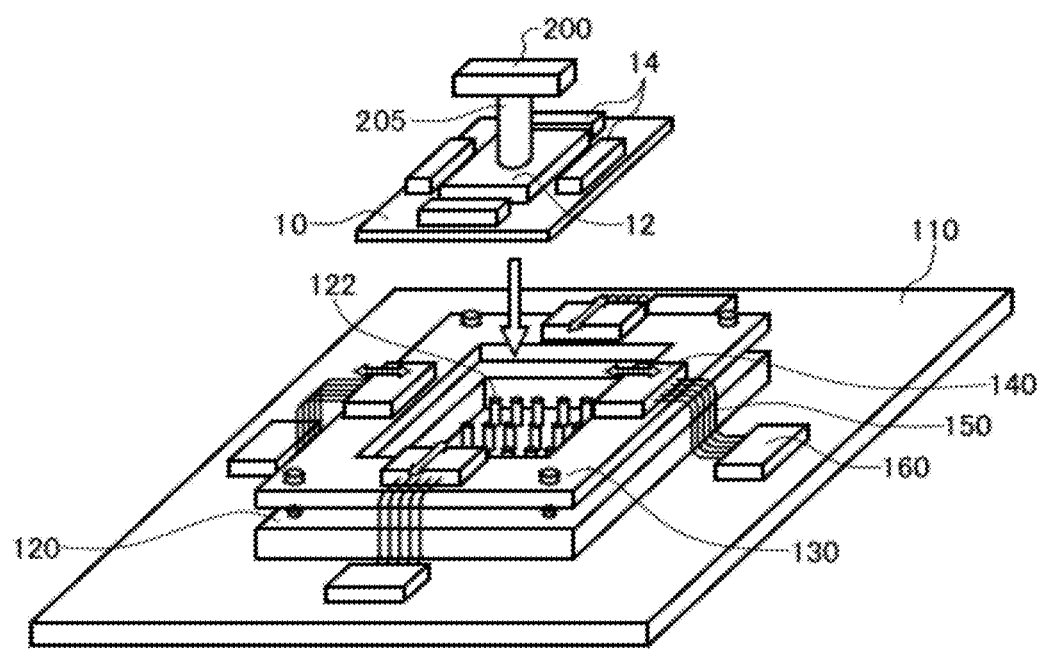
FIG. 1 shows an exemplary configuration of a device interface apparatus 100 according to an embodiment of the present invention, along with a module under test 10.
Figure 2:
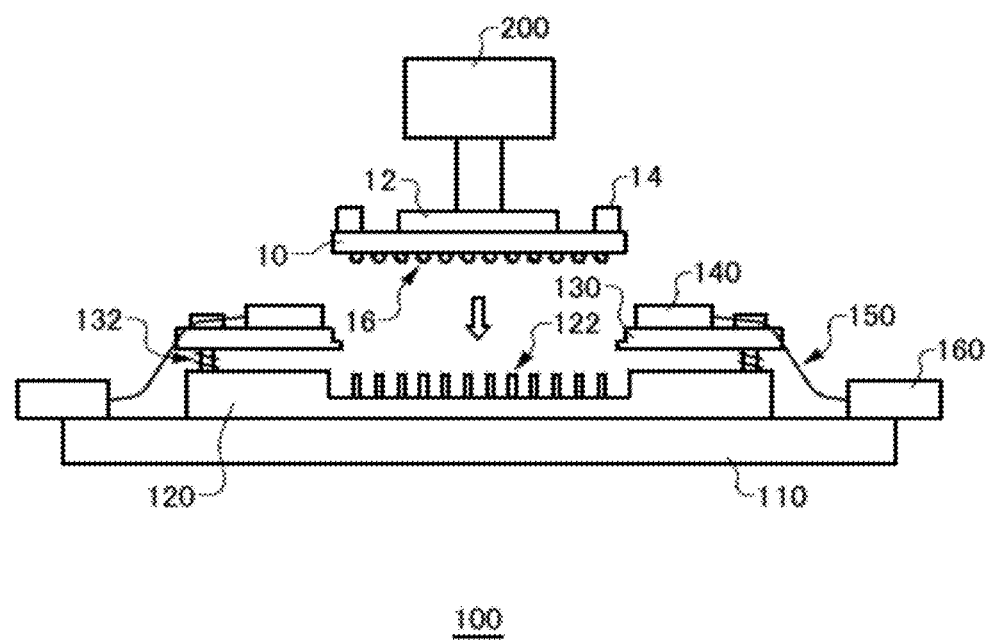
FIG. 2 shows an exemplary cross-section of the device interface apparatus 100 of the present embodiment, along with the module under test 10.

FIG. 1 shows an exemplary configuration of a device interface apparatus 100 according to an embodiment of the present invention, along with a module under test 10. FIG. 2 shows an exemplary cross-section of the device interface apparatus 100 of the present embodiment, along with the module under test 10. The module under test 10 or a device under test having an optical interface is loaded on the device interface apparatus 100, and the device interface apparatus 100 establishes an optical connection between the device under test and a test apparatus.

In the present embodiment, the device interface apparatus 100 establishes an optical connection with a module under test 10 including a device under test and an optical interface. If the device under test or the module under test 10 further includes an electrical interface that transmits electrical signals, the device interface apparatus 100 establishes both an optical connection and an electrical connection with the device under test or the module under test 10. The combination of the device under test, the optical interface, and the electrical interface may be referred to collectively as the device under test.

In the present embodiment, the device interface apparatus 100 establishes an optical connection and an electrical connection with a module under test 10 that includes an optical interface and an electrical interface. The module under test 10 includes one or more devices under test 12, one or more optical interfaces 14, and a device-side electrical terminal section 16. For ease of explanation, the following describes an example in which there is one each of the device under test 12 and the optical interface 14.

The device under test 12 may be an analog circuit, a digital circuit, a memory, or a system on chip (SOC), for example, and may include an optical input/output section that exchanges optical signals with the optical interface 14. The device under test 12 may receive an input electrical signal that results from an optical signal being converted into an electrical signal within the module under test 10, or an output electrical signal output from the device under test 12 may be converted into an optical signal within the module under test 10.

The optical interface 14 faces a side of the module under test 10. A plurality of optical interfaces 14 may be arranged on the module under test 10, in which case each optical interface 14 may be arranged to face a different side of the module under test 10. The optical interface 14 may include a connector that engages with an optical connector to enable optical signals to pass therebetween. The optical interface 14 may include an optical fiber in compliance with MT, MPO, LC, MU, SC, ST, or FC standards.

The device-side electrical terminal section 16 exchanges electrical signals with the module under test 10. The device-side electrical terminal section 16 may be a ball grid array (BGA) in which a plurality of solder bumps are arranged, or may be a land grid array (LGA) in which a plurality of flat electrode pads are arranged. The device-side electrical terminal section 16 may include one or more solder bumps, one or more lands, and/or a connector. The device-side electrical terminal section 16 may include one or more input terminals and one or more output terminals for exchanging electrical signals.

In order to exchange optical and electrical signals with the module under test 10 described above, the device interface apparatus 100 has the module under test 10 loaded thereon. The device interface apparatus 100 includes a substrate 110, a socket section 120, a device loading section 130, an optical connector 140, an optical transmission path 150, an optical port 160, and a handler apparatus 200.

The substrate 110 may be a performance board that is connected to the test apparatus, supplies the device under test or the module under test with test signals from the test apparatus, receives response signals output in response to the test signals supplied by the test apparatus, and supplies the test apparatus with the response signals. The substrate 110 may be formed according to operation speed, shape, number of pins, pin shape, optical connector shape and/or testing content of the module under test 10. Instead, the substrate 110 may be an interface board for interfacing with the module under test 10.

The socket section 120 is arranged on the substrate 110 and electrically connected to the module under test 10. The socket section 120 transmits to the module under test 10 the electrical signals sent from the substrate 110, and transmits to the substrate 110 the electrical signals sent from the module under test 10. The socket section 120 includes a socket-side electrical terminal section 122 connected to the device-side electrical terminal section 16 of the module under test 10.

The socket section 120 may be provided in advance with a socket-side electrical terminal section 122 having the shape, type, and number of terminals suitable for connection to the module under test 10, according to the shape, type, and number of terminals of the device-side electrical terminal section 16. The socket-side electrical terminal section 122 may include terminals, probes, cantilevers, or membrane film, for example that directly contact the device-side electrical terminal section 16.

If the device-side electrical terminal section 16 is a connector, the socket-side electrical terminal section 122 may be a connector that engages with the device-side electrical terminal section 16. The socket-side electrical terminal section 122 of the socket section 120 may include a number of terminals greater than or equal to the number of terminals in the device-side electrical terminal section 16 of the module under test 10, for example.

The module under test 10 is loaded on the device loading section 130. The device loading section 130 is provided to be moveable relative to the socket section 120, and is pressed toward the socket section 120 to electrically connect the module under test 10 and the socket section 120. The device loading section 130 may include a spring mechanism 132. The spring mechanism 132 is provided between the device loading section 130 and the socket section 120. With the spring mechanism 132, the device loading section 130 can be distanced from the socket section 120 when the socket section 120 is not being pressed and can be draw near the socket section 120 when the socket section 120 is being pressed.

The optical connector 140 is connected to the optical interface 14 of the module under test 10. If the optical interface 14 includes a connector, the optical connector 140 may include a connector that engages with the connector of the optical interface 14. The optical connector 140 may be closely affixed to the optical interface 14 to achieve an optical connection.

One end of the optical transmission path 150 is connected to the optical connector 140, and the other end is fixed to the substrate 110. The optical transmission path 150 may be a flexible transmission path such as an optical fiber, for example. The other end of the optical transmission path 150 may be connected to an optical port 160 fixed on the substrate 110. The device interface apparatus 100 may include a plurality of optical ports 160 and a plurality of optical transmission paths 150, in which case a portion of the optical transmission paths 150 may transmit optical test signals from corresponding optical ports 160 to the module under test 10 and another portion thereof may transmit optical signals output from the module under test 10 to corresponding optical ports 160.

The optical port 160 is fixed on the substrate 110. The optical port 160 may include a photoelectric converter or an electro-optical converter therein. The optical port 160 may convert an electrical signal supplied from the substrate 110 into an optical signal via the electro-optical converter and supply the optical signal to the optical transmission path 150. The optical port 160 may convert an optical signal transmitted from the optical transmission path 150 into an electrical signal using the photoelectric converter, and transmit the electrical signal to the substrate 110.

Instead, the optical port 160 may supply the optical transmission path 150 with an optical signal converted by an external electro-optical converter provided further from the module under test 10, or a test board of a test apparatus, than the optical port 160. As another example, the optical port 160 may transmit an optical signal received from the optical transmission path 150 to an external photoelectric converter.

The handler apparatus 200 transports the module under test 10 and loads the module under test 10 on the device interface apparatus 100. The handler apparatus 200 may include a device adhering section 205 that uses suction to fix the module under test 10 thereto. After fixing the module under test 10 thereto and loading the module under test 10 on the device loading section 130 of the device interface apparatus 100, the handler apparatus 200 may stop the suction to release the module under test 10. After the positioning of the module under test 10 on the device interface apparatus 100 has ended, the handler apparatus 200 may press the module under test 10 against the device interface apparatus 100 while the module under test 10 is being tested.

Figure 3A:
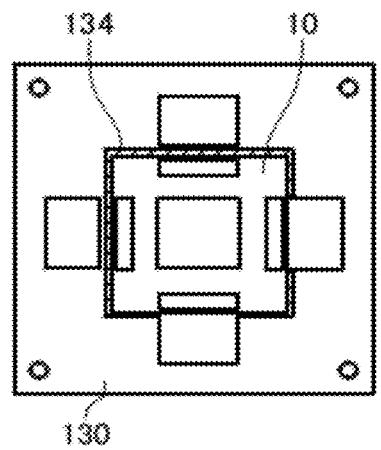
FIG. 3A shows an exemplary top view of the device loading section 130 according to the present invention, along with the module under test 10.
Figure 3B:
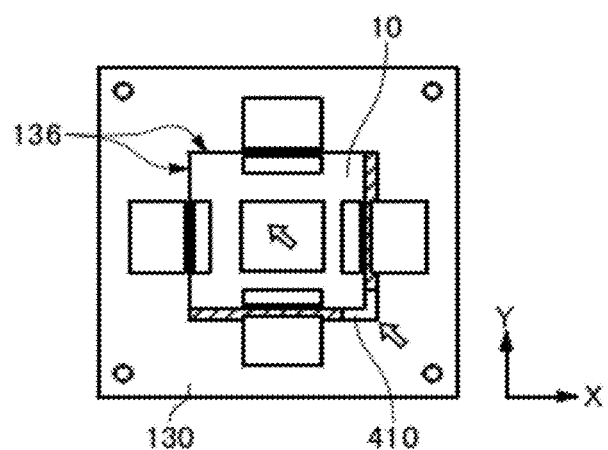
FIG. 3B shows an exemplary top view when the module under test 10 is loaded on the device loading section 130 of the present invention.
Figure 3C:
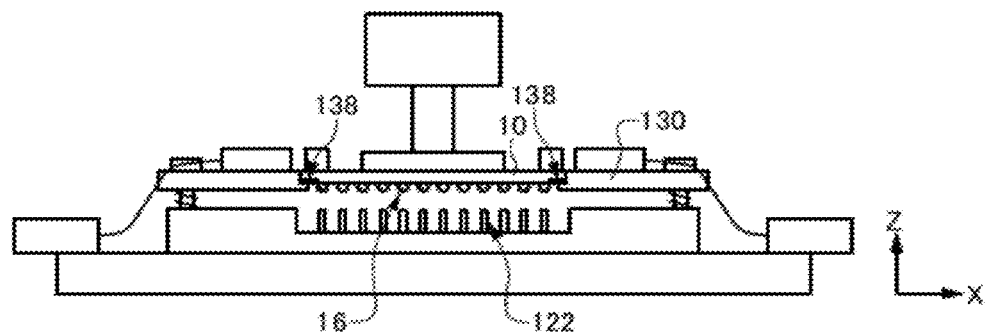
FIG. 3C shows an exemplary cross-sectional view when the module under test 10 is loaded on the device loading section 130 of the present embodiment.

FIG. 3A shows an exemplary top view of the device loading section 130 according to the present invention, along with the module under test 10. FIG. 3B shows an exemplary top view when the module under test 10 is loaded on the device loading section 130 of the present invention. FIG. 3C shows an exemplary cross-sectional view when the module under test 10 is loaded on the device loading section 130 of the present embodiment.

The device loading section 130 may include a positioning section 410 that positions the module under test 10 on the device loading section 130 prior to the device-side electrical terminal section 16 and the socket-side electrical terminal section 122 being brought into contact with each other. The positioning section 410 may be claw-shaped, and may press the module under test 10 to fix the module under test 10 on the device loading section 130. The device loading section 130 may include an indentation 134 in which at least a portion of the module under test 10 is arranged. For example, FIG. 3A shows a state in which the module under test 10 is arranged in the indentation 134 of the device loading section 130.

In this state, the positioning section 410 sets the position of the module under test 10 in the device loading section 130 by pressing the module under test 10 against a reference surface 136 provided on the inner walls in the indentation 134. For example, in FIG. 3B, the device loading section 130 has reference surfaces 136 on the top and left walls of the indentation 134, among the four walls at the top, bottom, right, and left sides thereof. The positioning section 410 may be driven by electricity, magnetism, or gas, for example, to position the module under test 10 by pressing the module under test 10 in the direction of the arrow in FIG. 3B such that the module under test 10 is pressed against the two reference surfaces 136.

The positioning section 410 may set the position of the module under test 10 by pressing the module under test 10 against a reference surface 138 oriented in the Z direction, such that the module under test 10 is parallel to the X-Y plane. The device interface apparatus 100 may prearrange the optical connector 140 such that, when the module under test 10 has been fixed in a position above the socket section 120 by the positioning section 410, the optical interfaces 14 of the module under test 10 face the corresponding optical connectors 140. The positioning section 410 can set the positions of other components, such as setting the position of the module under test 10 relative to the device loading section 130, in the same manner.

Figure 4:
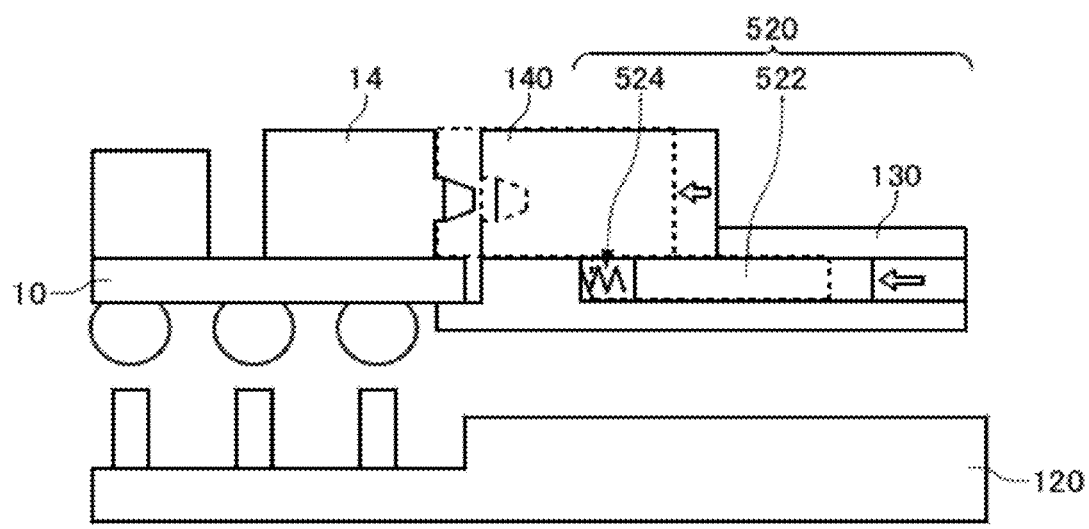
FIG. 4 shows an exemplary configuration of an optical connector moving section 520 according to the present embodiment, along with the module under test 10.

FIG. 4 shows an exemplary configuration of an optical connector moving section 520 according to the present embodiment, along with the module under test 10. The device loading section 130 of the device interface apparatus 100 further includes the optical connector moving section 520, which is connected to the optical connector 140. The optical connector moving section 520 connects the optical interface 14 and the optical connector 140 by moving the optical connector 140 toward the optical interface 14 of the module under test 10 loaded on the device loading section 130.

The optical connector moving section 520 moves the optical connector 140 toward the optical interface 14 in a direction parallel to the surface of the device loading section 130 on which the module under test is loaded. After the position of the module under test 10 on the device loading section 130 is fixed, the optical connector moving section 520 may move the optical connector 140. The optical connector moving section 520 includes a cylinder 522 and an elastic body 524.

The cylinder 522 moves the optical connector 140 toward the optical interface 14 using gas pressure received from the outside. The cylinder 522 may be a cylindrical component that houses a gas or liquid therein. The cylinder 522 presses in the direction of the arrow in FIG. 4 due to pressurized gas being injected from the outside, thereby moving the optical connector 140 fixed to the cylinder 522 toward the optical interface 14. Instead, the cylinder 522 may move the optical connector 140 using electricity or magnetism, for example.

The elastic body 524 presses the optical connector 140 and the optical interface 14 away from each other when the cylinder 522 is not being pressed by the pressurized gas. The elastic body 524 may be a spring. In this way, the optical connector moving section 520 can separate the optical interface 14 and the optical connector 140 when the pressing force exerted by the cylinder 522 due to the pressurized gas is not sufficient to move the optical connector 140, and can move the optical connector 140 toward the optical interface 14 when the pressing force exerted by the cylinder 522 due to the pressurized gas is sufficient to move the optical connector 140.

Figure 5:
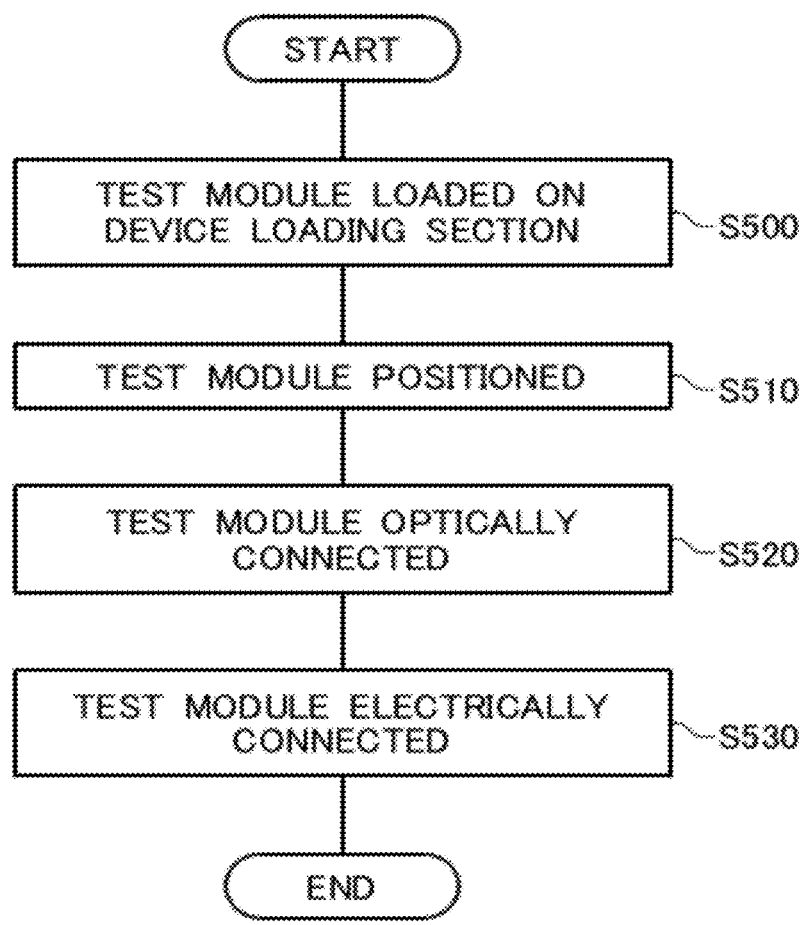
FIG. 5 shows a process flow of the device interface apparatus 100 according to the present embodiment.
Figure 6A:
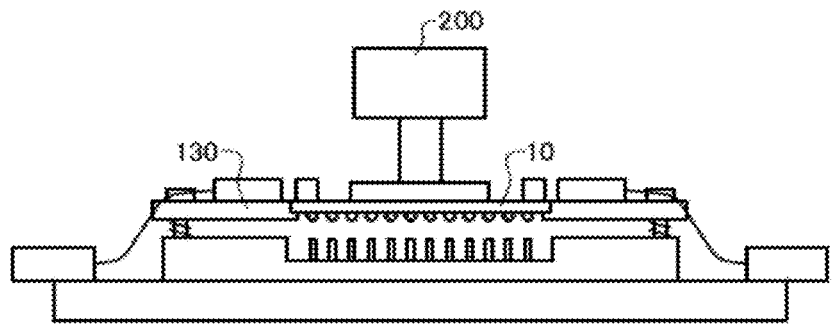
FIG. 6A shows a state in which the module under test 10 is loaded on the device loading section 130 of the present embodiment.
Figure 6B:
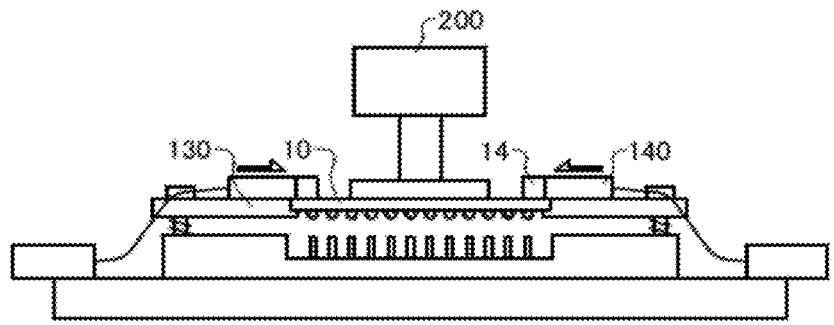
FIG. 6B shows a state in which the optical connector 140 of the present embodiment is connected to the optical interface 14 of the module under test 10.
Figure 6C:
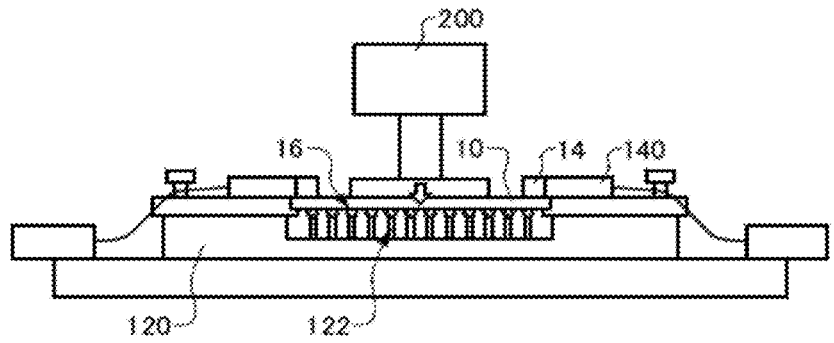
FIG. 6C shows a state in which the device interface apparatus 100 of the present embodiment is electrically and optically connected to the module under test 10.

FIG. 5 shows a process flow of the device interface apparatus 100 according to the present embodiment. FIG. 6A shows a state in which the module under test 10 is loaded on the device loading section 130 of the present embodiment. FIG. 6B shows a state in which the optical connector 140 of the present embodiment is connected to the optical interface 14 of the module under test 10. FIG. 6C shows a state in which the device interface apparatus 100 of the present embodiment is electrically and optically connected to the module under test 10.

The device interface apparatus 100 uses the handler apparatus 200 to transport the module under test 10 and load the module under test 10 on the device loading section 130 (S500). The handler apparatus 200 may use the device adhering section 205 to exert suction on the module under test 10 to adhere the module under test 10 thereto, and then transport the module under test 10. Next, the handler apparatus 200 cuts off the suction of the device adhering section 205. The device loading section 130 uses the positioning section 410 to set the position of the module under test 10 by pressing the module under test 10 against the reference surfaces 136 (S510). FIG. 6A shows the state in which the module under test 10 is loaded and positioned on the device loading section 130.

Next, the optical connector moving section 520 establishes an optical connection by moving the optical connector 140 toward the optical interface 14 of the module under test 10 positioned on the device loading section 130 (S520). Here, the device interface apparatus 100 may check whether the optical connection is in fact established.

For example, the device interface apparatus 100 may output an optical pulse with a prescribed strength from the optical connector 140 to the module under test 10 and measure the strength of the reflected light. If there is a problem with the optical connection between the optical connector 140 and the optical interface 14, the device interface apparatus 100 can measure the dispersed light therebehind, thereby checking whether the optical connection is established.

If the module under test 10 includes one or more optical circuits that transmit optical signals from one optical interface 14 to another optical interface 14, the device interface apparatus 100 may check whether the optical connection is established by inputting an optical signal with a prescribed strength from one optical connector 140 to an optical circuit and receive the optical signal passed through the optical circuit with another optical connector 140, and measure the strength of this received optical signal. If the optical connection is not established, the device interface apparatus 100 may release the module under test 10 from the fixed position and repeat the process of using the handler apparatus 200 to transport the module under test 10 and load the module under test 10 on the device loading section 130, until an optical connection is successfully established.

If the optical connection cannot be established even after a predetermined number of repetitions, the device interface apparatus 100 may determine that the module under test 10 is defective and stop the loading of the module under test 10. If there is another module under test 10 to be loaded, the device interface apparatus 100 may proceed to load this other module under test 10 after determining that the previous module under test 10 is defective. FIG. 6B shows a state in which the optical connector 140 is connected to the optical interface 14 of the module under test 10.

Next, with the optical connection between the optical interface 14 and the optical connector 140 established, the device loading section 130 is pressed against the socket section 120, and the socket section 120 connects the socket-side electrical terminal section 122 to the device-side electrical terminal section 16 of the module under test 10 loaded on the device loading section 130 being pressed (S530). Here, the handler apparatus 200 uses the device adhering section 205 to again adhere the module under test 10 thereto and presses the module under test 10 against the socket section 120.

The handler apparatus 200 may include a pressing section that directly contacts the device loading section 130 and presses the device loading section 130 against the socket section 120. Instead, the device loading section 130 may include a mechanism that holds the module under test 10 and moves the module under test 10 downward, thereby forming the connection between the device-side electrical terminal section 16 and the socket-side electrical terminal section 122.

The socket-side electrical terminal section 122 of the socket section 120 may be prearranged such that, when the module under test 10 is positioned on the device loading section 130 and then moved downward, the socket-side electrical terminal section 122 is suitably connected to the device-side electrical terminal section 16 of the module under test 10. FIG. 6C shows a state in which the socket-side electrical terminal section 122 and the device-side electrical terminal section 16 of the module under test 10 are electrically connected. As a result of the process flow of the present embodiment, the device interface apparatus 100 can be electrically connected to the device-side electrical terminal section 16 of the module under test 10 while maintaining the optical connection with the optical interface 14 of the module under test 10.

Figure 7:
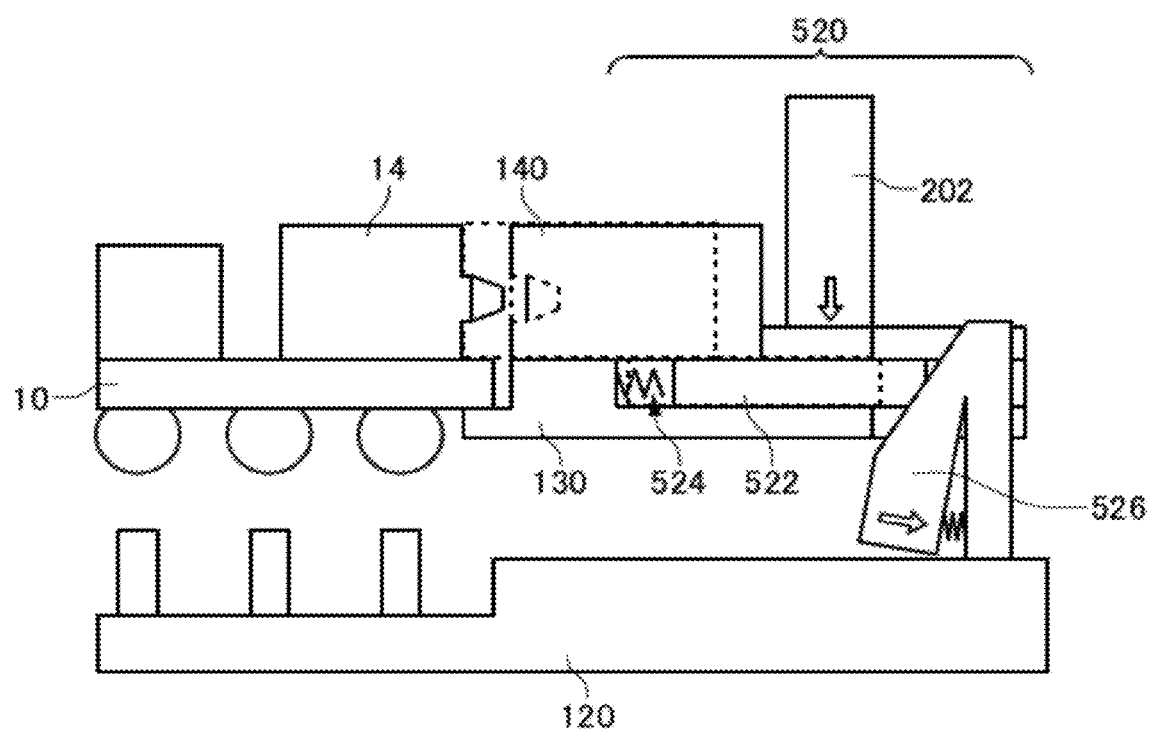
FIG. 7 shows an exemplary modification of the optical connector moving section 520, along with the module under test 10.

In the embodiment described above, the optical connector moving section 520 moves the optical connector 140 using gas pressure. Instead, the optical connector moving section 520 may use the force of the handler apparatus 200. FIG. 7 shows an exemplary modification of the optical connector moving section 520, along with the module under test 10. In the optical connector moving section 520 of the present modification, components that have substantially the same operation as components in the optical connector moving section 520 of FIG. 4 are given the same reference numerals, and further description is omitted. The optical connector moving section 520 further includes a movable section 526.

The movable section 526 includes a pillar portion of which one end is attached on the socket section 120 and the other end extends upward from the socket section 120, and an arm portion of which a first end is attached to the other end of the pillar portion via a rotating axle parallel to the socket section 120 and a second end extends toward the socket section 120. The movable section 526 may further include a spring provided between the region near the socket section 120 at the one end of the pillar portion and the region near the socket section 120 at the second end of the arm portion, to bias the second end of the arm portion toward the module under test 10.

The optical connector moving section 520 biases the optical connector 140 toward the optical interface 14 according to the pressing of the device loading section 130 toward the socket section 120. Here, the device loading section 130 may be pressed toward the socket section 120 by a pressing section 202 of the handler apparatus 200. The arm portion of the movable section 526 may be wedge-shaped. The device loading section 130 presses the movable section 526 in a vertical direction according to the movement of the device loading section 130 toward the socket section 120.

The movable section 526 presses the cylinder 522 by converting the vertical force exerted by the device loading section 130 into a horizontal force, using the wedge-shaped arm portion, to move the optical connector 140 toward the optical interface 14 in a direction parallel to the surface of the device loading section 130 on which the module under test is loaded. As a result, the device interface apparatus 100 can achieve the electrical connection after the optical connection with the module under test 10 by moving the socket section 120 of the device loading section 130, without using external gas pressure.

Figure 8:
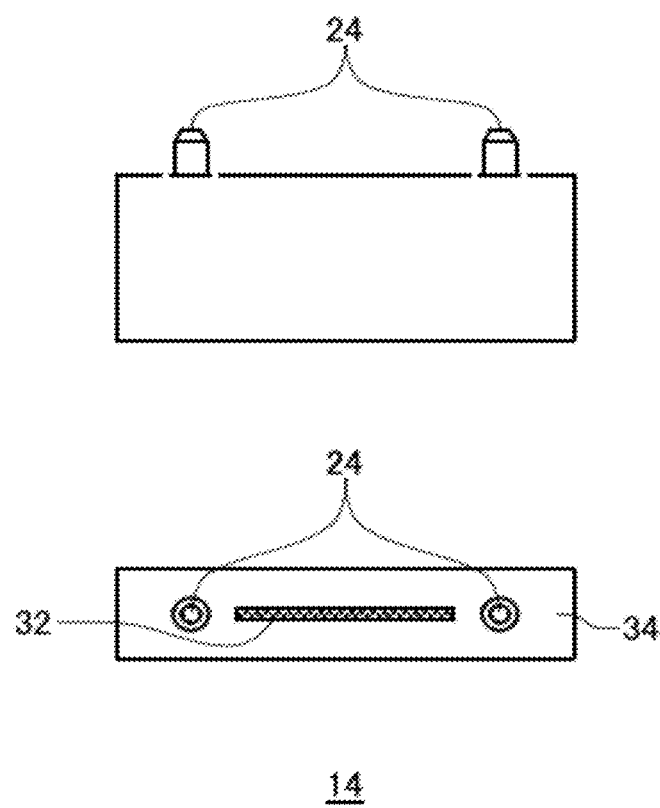
FIG. 8 shows a top view and a side view of an optical interface 14 of the module under test 10 according to the present embodiment.

In the embodiment described above, the optical connector 140 engages with the optical interface 14 by moving toward the optical interface 14. Here, the optical connector 140 may further include a mechanism that enables engagement with the optical interface 14 by moving toward the optical interface 14 even if the optical interface 14 is misaligned. FIG. 8 shows a top view and a side view of an optical interface 14 of the module under test 10 according to the present embodiment.

Figure 9:
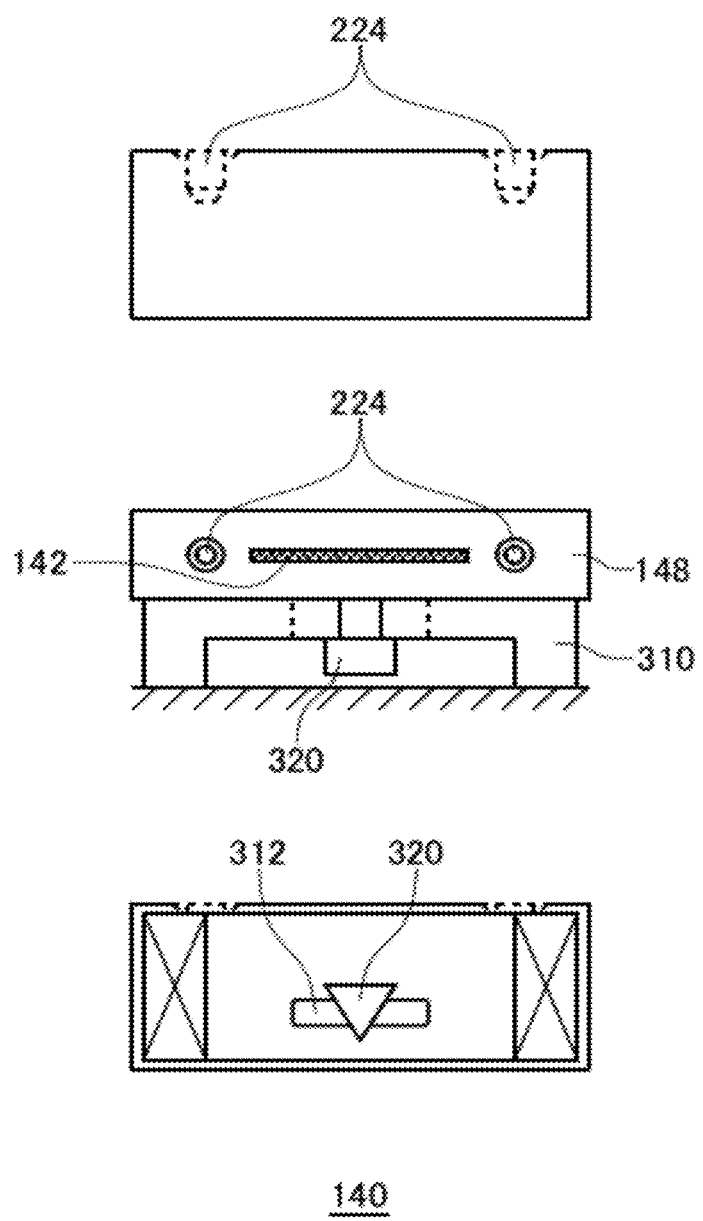
FIG. 9 shows three surfaces of the optical connector 140 according to the present embodiment.

FIG. 9 shows three surfaces of the optical connector 140 according to the present embodiment.

The optical interface 14 includes guide pins 24, an optical signal input/output section 32, and a device-side plug section 34. The optical interface 14 in the present example includes an optical connector in which the guide pins 24 serve as guides when engaging with a corresponding connector. The optical signal input/output section 32 may be formed by exposing an end surface of one or more waveguides. The end of the waveguide may be processed to be spherical, or may be processed to be a flat surface oriented at a predetermined angle. The device-side plug section 34 engages with the optical signal input/output section 32 and the optical connector 140 surrounding the optical signal input/output section 32.

The optical connector 140 is held by the device loading section 130. The optical connector 140 may be held by the device loading section 130 to be rotatable on a central axis that is perpendicular to the surface of the device loading section 130 on which the module under test 10 is loaded. The optical connector 140 may be held by the device loading section 130, on the surface of the device loading section 130 on which the module under test 10 is loaded, to be movable in a horizontal direction perpendicular to the direction in which the optical signal is propagated.

The optical connector 140 includes an optical signal input/output section 142, guide holes 224, a connector-side plug section 148, a connector board 310, and a protruding portion 320. The optical signal input/output section 142 may be formed by exposing one end of each of a plurality of optical transmission paths 150, and an optical connection can be achieved by each surface of an optical transmission path 150 physically contacting a corresponding end of a waveguide of the optical signal input/output section 32.

The guide holes 224 are formed to correspond to the guide pins 24, and the optical connector 140 and the optical interface 14 are engaged with each other by moving the optical connector 140 toward the optical interface 14 such that the guide pins 24 are inserted into the guide holes 224. The connector-side plug section 148 engages with the device-side plug section 34 surrounding the optical transmission paths 150.

The connector board 310 holds the connector-side plug section 148 in a manner to allow movement. The connector board 310 may be supported by the cylinder 522 and may move in one direction on the device loading section 130 while holding the connector-side plug section 148. As a result, the optical connector 140 moves toward the optical interface 14.

The connector board 310 may include a groove, to appear U-shaped when viewed from the side. The connector board 310 includes a protruding portion 320 in the groove. The protruding portion 320 is connected to the connector-side plug section 148 via a spacing hole 312 of the connector board 310, which allows the protruding portion 320 to move freely, and the connector-side plug section 148 is held by the connector board 310 in a manner allowing rotation and movement to the left and right.

Figure 10:
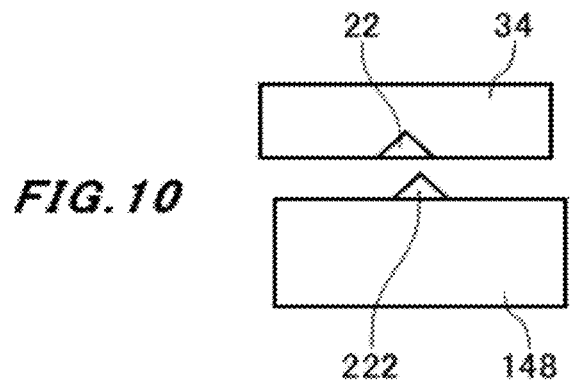
FIG. 10 shows a top view of the device-side plug section 34 of the optical interface 14 and the connector-side plug section 148 of the present embodiment.

The device-side plug section 34 and the connector-side plug section 148 include a position adjusting mechanism, at the optical interface 14 and the optical connector 140, for adjusting the relative positions of the device-side plug section 34 and the connector-side plug section 148 when establishing the optical connection between the optical interface 14 and the optical connector 140. FIG. 10 shows a top view of the device-side plug section 34 of the optical interface 14 and the connector-side plug section 148 of the present embodiment. One of the device-side plug section 34 and the connector-side plug section 148 includes a notch 22, and the other includes a protruding portion 222 that engages with the notch 22.

In the example of FIG. 10, the device-side plug section 34 includes the notch 22 and the connector-side plug section 148 includes the protruding portion 222. As an example, the notch 22 is a V-shaped groove and the protruding portion 222 is a triangular protrusion. When the position of the module under test 10 is set, there may be positional misalignment between the optical connector 140 and the optical interface 14, for example.

In this case, as long as the protruding portion 222 is within a range capable of engaging with the notch 22, the protruding portion 222 can engage with the notch 22 as a result of the optical connector 140 moving toward the optical interface 14. In this way, the connector-side plug section 148 can be adjusted to have the proper positioning with respect to the device-side plug section 34. Therefore, the connector-side plug section 148 can engage with the device-side plug section 34 and the device interface apparatus 100 can establish the optical connection between the optical connector 140 and the optical interface 14.

Figure 11:
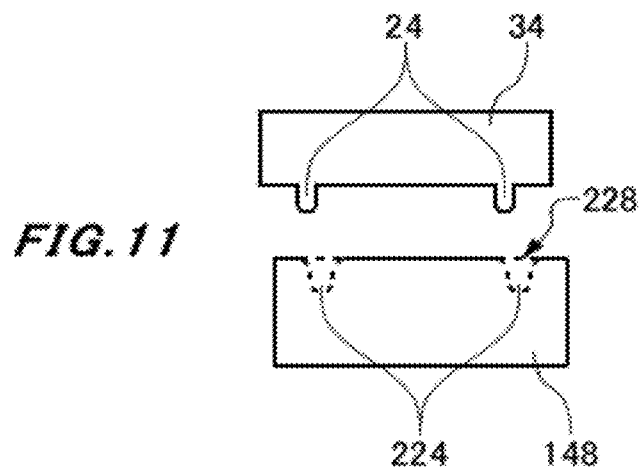
FIG. 11 shows a top view of a first modification of the device-side plug section 34 of the optical interface 14 and the connector-side plug section 148 according to the present embodiment.

FIG. 11 shows a top view of a first modification of the device-side plug section 34 of the optical interface 14 and the connector-side plug section 148 according to the present embodiment. One of the device-side plug section 34 and the connector-side plug section 148 includes guide pins 24, and the other includes guide holes 224. The guide holes 224 may have a vase shape 228, such that the openings thereof have a greater width than the deeper portions thereof, to guide the guide pins 24 into the guide holes 224.

In the example of FIG. 11, the device-side plug section 34 includes the guide pins 24, and the connector-side plug section 148 includes the guide holes 224 having the vase shapes 228. In this way, when the position of the module under test 10 is fixed, the relative positions of the optical connector 140 and the optical interface 14 can be adjusted.

For example, by moving the optical connector 140 toward the optical interface 14, the guide pins 24 can contact the vase shapes 228 to be guided into the guide holes 224. As a result, the guide pins 24 engage with the guide holes 224, and the position of the connector-side plug section 148 is adjusted to have the correct relative position with respect to the device-side plug section 34. Accordingly, the connector-side plug section 148 can engage with the device-side plug section 34, and the device interface apparatus 100 can establish the optical connection between the optical connector 140 and the optical interface 14.

Figure 12:
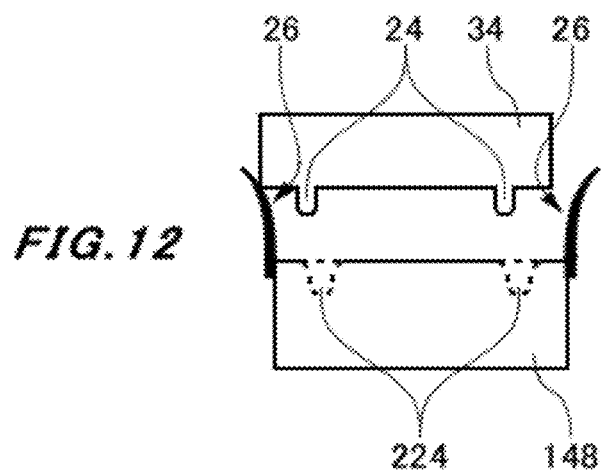
FIG. 12 shows a top view of a second modification of the device-side plug section 34 of the optical interface 14 and the connector-side plug section 148 according to the present embodiment.

FIG. 12 shows a top view of a second modification of the device-side plug section 34 of the optical interface 14 and the connector-side plug section 148 according to the present embodiment. One of the device-side plug section 34 and the connector-side plug section 148 includes a guide 26 on the periphery thereof. The guide 26 may guide a plug section, which is provided on the other of the device-side plug section 34 and the connector-side plug section 148. The guide 26 may have the characteristics of a spring. In the example of FIG. 12, the connector-side plug section 148 includes the guide 26.

In this way, by moving the optical connector 140 toward the optical interface 14, the guide pins 24 are guided by the guide 26 to be engaged with the guide holes 224. Accordingly, even when the position of the connector-side plug section 148 is misaligned with respect to the device-side plug section 34, the connector-side plug section 148 can be adjusted to have the correct relative position. As a result, the connector-side plug section 148 can engage with the device-side plug section 34, and the device interface apparatus 100 can establish the optical connection between the optical connector 140 and the optical interface 14.

Furthermore, in response to the optical connector 140 being distanced from the optical interface 14, the device loading section 130 may cause the position and orientation of the optical connector 140 to be a predetermined position and orientation in a horizontal direction and a rotational direction. For example, as the optical connector 140 moves away from the optical interface 14, the device loading section 130 may limit the freedom of the optical connector 140 in the horizontal and rotational directions.

Figure 13A:
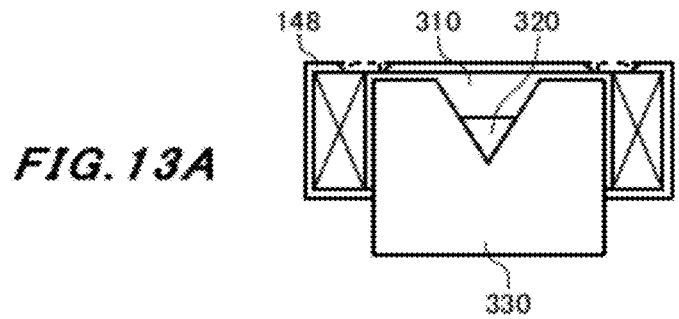
FIG. 13A shows a top view of a state according to the present embodiment in which the optical connector 140 is fixed at a predetermined position, as seen from the device loading section 130.
Figure 13B:
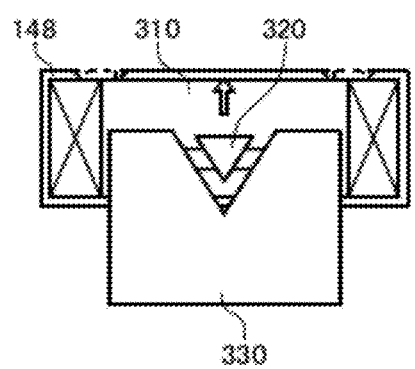
FIG. 13B shows a top view of a state according to the present embodiment in which the optical connector 140 moves toward the optical interface 14, as seen from the device loading section 130.
Figure 13C:
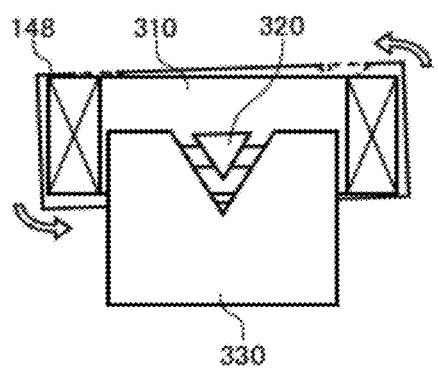
FIG. 13C shows a top view of a state according to the present embodiment in which the optical connector 140 moves toward the optical interface 14 while rotating, as seen from the device loading section 130.
Figure 13D:
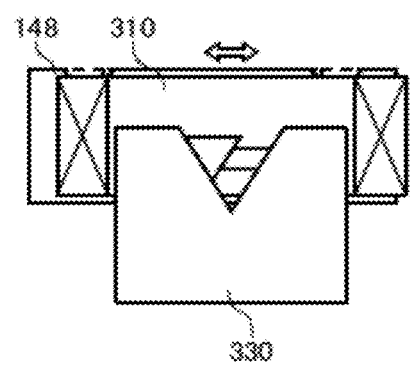
FIG. 13D shows a top view of a state according to the present embodiment in which the optical connector 140 moves toward the optical interface 14 while moving horizontally, as seen from the device loading section 130.

FIG. 13A shows a top view of a state according to the present embodiment in which the optical connector 140 is fixed at a predetermined position, as seen from the device loading section 130. FIG. 13B shows a top view of a state according to the present embodiment in which the optical connector 140 moves toward the optical interface 14, as seen from the device loading section 130. FIG. 13C shows a top view of a state according to the present embodiment in which the optical connector 140 moves toward the optical interface 14 while rotating, as seen from the device loading section 130. FIG. 13D shows a top view of a state according to the present embodiment in which the optical connector 140 moves toward the optical interface 14 while moving horizontally, as seen from the device loading section 130.

The device loading section 130 includes a grooved portion 330 with a V-shaped groove that engages with the protruding portion 320 when the optical connector 140 moves away from the optical interface 14. In the state shown in FIG. 13A where the optical connector 140 is distanced from the optical interface 14, the protruding portion 320 engages with the grooved portion 330, and so the device loading section 130 can limit the freedom of the optical connector 140 in the horizontal and rotational directions. As a result, when the module under test 10 is removed from the device loading section 130, the optical connector 140 is moved away from the optical interface 14 and returned to a predetermined holding position.

The two inner surfaces of the V-shaped groove of the grooved portion 330 may engage with the U-shaped groove in the connector board 310. The sides of the grooved portion 330 are formed perpendicular to the direction of the optical interface 14, and so the connector board 310 moves toward the optical interface 14 along the surfaces of the grooved portion 330. In other words, the optical connector 140 can move toward the optical interface 14. Furthermore, the optical connector 140 can return to a predetermined holding position distanced from the optical interface 14 along the surfaces of the grooved portion 330.

When the optical connector 140 moves toward the optical interface 14, as shown in FIG. 13B, the protruding portion 320 moves away from the grooved portion 330, and therefore the optical connector 140 can move toward the optical interface 14 while maintaining freedom of movement in the horizontal and rotational directions. For example, if the position of the module under test 10 is set when the relative positions of the optical connector 140 and the optical interface 14 are misaligned in the rotational direction, the connector-side plug section 148 moves toward the optical interface 14 while moving in the rotational direction to engage with the optical interface 14, as shown in FIG. 13C.

In other words, the optical connector 140 can move the protruding portion 320 away from the grooved portion 330 by moving toward the optical interface 14, and therefore the optical connector 140 can move in the rotational direction. When the engagement with the optical interface 14 is released, the optical connector 140 may move away from the optical interface 14 in a straight line. In this case, the protruding portion 320 gradually engages with the groove of the grooved portion 330 as the optical connector 140 moves away from the optical interface 14, and so the orientation of the optical connector 140 becomes the predetermined orientation.

If the position of the module under test 10 is set when the relative positions of the optical connector 140 and the optical interface 14 are misaligned in the horizontal direction, the connector-side plug section 148 moves toward the optical interface 14 while moving horizontally to engage with the optical interface 14, as shown in FIG. 13D. When the engagement with the optical interface 14 is released, the optical connector 140 may move away from the optical interface 14 in a straight line.

In this case, the protruding portion 320 gradually engages with the groove of the grooved portion 330 as the optical connector 140 moves away from the optical interface 14, and so the horizontal position of the optical connector 140 becomes the predetermined position. In the present embodiment, the protruding portion 320 includes a triangular protruding portion 320 and the grooved portion 330 includes a V-shaped groove, but instead, the protruding portion 320 may include the V-shaped groove and the grooved portion 330 may include the triangular protruding portion 320.

Figure 14:
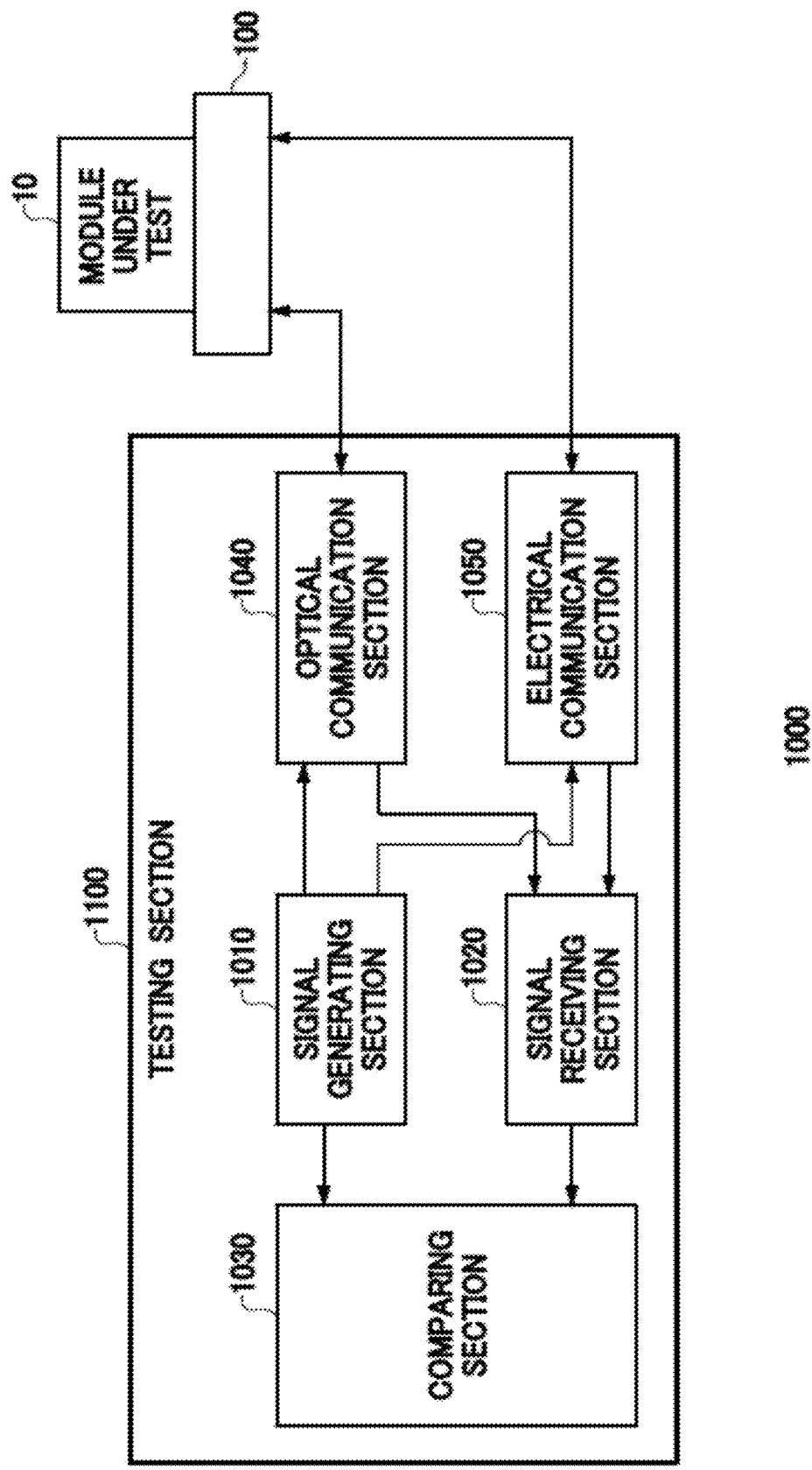
FIG. 14 shows an exemplary configuration of a test apparatus 1000 according to an embodiment of the present invention, along with a module under test 10.

FIG. 14 shows an exemplary configuration of a test apparatus 1000 according to an embodiment of the present invention, along with a module under test 10. The test apparatus 1000 tests a module under test that includes an optical interface. The test apparatus 1000 supplies the module under test 10 with a test signal based on a test pattern for testing the module under test 10, and judges pass/fail of the module under test 10 based on the output signal output by the module under test 10 in response to the test signal. Test signals supplied to the module under test 10 by the test apparatus 1000 may be electric signals and/or optical signals, and the output signals output by the module under test 10 may also be electric signals and/or optical signals.

The test apparatus 1000 includes the device interface apparatus 100 and a testing section 1100. The device interface apparatus 100 is the device interface apparatus described in the above embodiment, and the module under test 10 is loaded thereon to be electrically and optically connected to the device interface apparatus 100. The testing section 1100 is connected to the module under test 10 via the device interface apparatus 100, and tests the module under test 10. The testing section 1100 includes a signal generating section 1010, a signal receiving section 1020, a comparing section 1030, an optical communication section 1040, and a electrical communication section 1050.

The signal generating section 1010 generates a plurality of test signals to be supplied to the module under test 10, according to a test program. The signal generating section 1010 transmits test signals to the optical communication section 1040 when supplying optical test signals to the module under test 10. The optical communication section 1040 supplies the module under test 10 with the optical test signals obtained by performing an electro-optical conversion on the received test signals.

The signal generating section 1010 transmits test signals to the electrical communication section 1050 when supplying electrical test signals to the module under test 10. The electrical communication section 1050 supplies the module under test 10 with the received test signals. The signal generating section 1010 may generate expected values for response signals output by the module under test 10 in response to the test signals, and transmit the expected values to the comparing section 1030.

When an optical response signal output by the module under test 10 in response to an electrical or optical test signal is received, the optical communication section 1040 transmits to the signal receiving section 1020 a response signal obtained by performing an optical-electro conversion on the optical response signal. When an electrical response signal output by the module under test 10 in response to an electrical or optical test signal is received, the electrical communication section 1050 transmits the received response signal to the signal receiving section 1020. The signal receiving section 1020 may transmit the received response signal to the comparing section 1030. The signal receiving section 1020 may record the received response signal in a recording apparatus.

The comparing section 1030 compares the response signal received from the signal receiving section 1020 to the expected value received from the signal generating section 1010. The test apparatus 1000 may judge pass/fail of the module under test 10 based on the comparison result by the comparing section 1030. In this way, the test apparatus 1000 can test a module under test 10 including an optical interface by exchanging optical signals and electrical signals with the module under test 10.

Furthermore, the test apparatus 1000 can exchange test signals and response signals with the module under test 10 at high speed, by transmitting high-frequency signals over several hundred MHz, which are difficult to send as electric signals, as optical signals. In this way, the test apparatus 1000 can test the module under test 10 while causing the module under test 10 to operate at its actual operating speed.

The testing section 1100 in the test apparatus 1000 of the present embodiment includes the optical communication section 1040 and exchanges optical signals with the device interface apparatus 100, but instead, the optical communication section 1040 may be included in the substrate 110 of the device interface apparatus 100. In this way, by exchanging electrical signals with the device interface apparatus 100, the testing section 1100 can exchange electrical signals and optical signals between the device interface apparatus 100 and the module under test 10, and the role of the testing section 1100 can be realized as a portion of a common test apparatus, for example.

Figure 15:
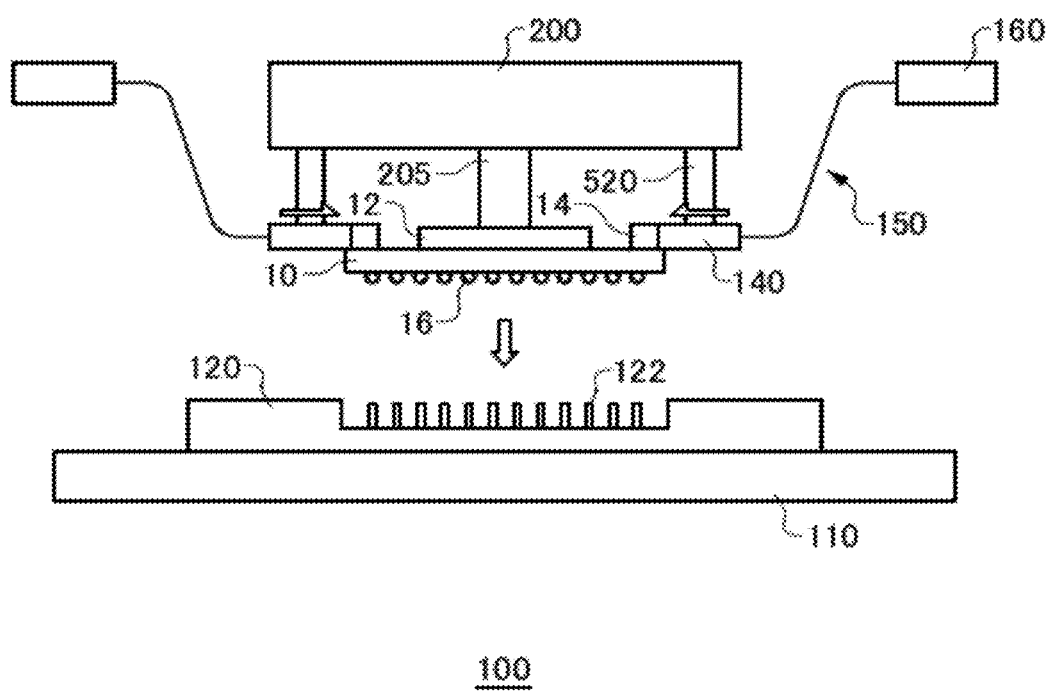
FIG. 15 shows a modification of the device interface apparatus 100 according to the present embodiment, along with the module under test 10.

FIG. 15 shows a modification of the device interface apparatus 100 according to the present embodiment, along with the module under test 10. In the device interface apparatus 100 of the present modification, the components having substantially the same operation as components of the device interface apparatus 100 shown in FIG. 2 are given the same reference numerals and further description is omitted. The device interface apparatus 100 of the present modification includes a substrate 110, an optical port 160, and a handler apparatus 200.

The substrate 110 may be a performance board that includes a socket section 120 having a socket-side electrical terminal section 122 to be connected to a device-side electrical terminal section 16. The handler apparatus 200 includes a device adhering section 205 that adheres the module under test 10 thereto via suction and an optical connector moving section 520 that adheres the optical connector 140 thereto via suction and moves the optical connector 140 toward the optical interface 14 of the module under test 10. The optical connector moving section 520 of the present modification has a suction function for attaching and detaching the optical connector 140, in addition to the movement mechanism of the optical connector moving section 520 of the present embodiment.

The handler apparatus 200 transports the module under test 10, the optical connector 140, and the optical connector moving section 520 together, and presses the module under test 10 against the socket section 120 on the substrate 110. The device interface apparatus 100 fixes the module under test 10 using the suction of the device adhering section 205, and fixes the optical connector 140 using the suction of the optical connector moving section 520. The optical connector moving section 520 moves the optical connector 140 toward the optical interface 14, and optically connects the optical interface 14 to the optical connector 140.

The device interface apparatus 100 presses the optical connector 140 and the module under test 10, which are optically connected, toward the socket section 120 while maintaining the suction on both, to electrically connect the device-side electrical terminal section 16 of the module under test 10 and the socket-side electrical terminal section 122. In this way, the device interface apparatus 100 can establish an optical connection and an electrical connection with the module under test 10.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A device interface apparatus on which is loaded a device under test including an optical interface, the device interface apparatus comprising: a device loading section on which the device under test is loaded; an optical connector that is to be connected to the optical interface of the device under test for transmitting and receiving an optical signal to and from the optical interface; and an optical connector moving section that moves the optical connector toward the optical interface of the device under test loaded on the device loading section, to optically connect the optical connector and the optical interface, wherein the device under test includes an optical interface facing a side of the device under test, and the optical connector moving section moves the optical connector toward the optical interface in a direction parallel to a device loading surface of the device loading section on which the module under test is loaded.

2. The device interface apparatus according to claim 1, wherein
the device loading section holds the optical connector in a manner to be rotatable on a central axis perpendicular to the device loading surface.

3. The device interface apparatus according to claim 2, wherein the device loading section holds the optical connector on the device loading surface to be movable in a horizontal direction perpendicular to a direction in which an optical signal is propagated.

4. The device interface apparatus according to claim 3, wherein
the optical interface includes an optical signal input/output section and a device-side plug section that engages with the optical connector and surrounds a periphery of the optical signal input/output section,
the optical connector includes an optical transmission path that optically connects to the optical signal input/output section and a connector-side plug section that engages with the device-side plug section and surrounds a periphery of the optical transmission path, and
the device-side plug section and the connector-side plug section include a position adjusting mechanism that adjusts relative positions of the device-side plug section and the connector-side plug section when optically connecting the optical interface and the optical connector.

5. The device interface apparatus according to claim 3, wherein
as the optical connector moves away from the optical interface, the device loading section adjusts position and orientation of the optical connector to be a predetermined position and a predetermined orientation in a horizontal direction and a rotational direction.

6. The device interface apparatus according to claim 1, wherein
the device under test further includes a device-side electrical terminal section for exchanging electrical signals with the outside,
the device interface apparatus further comprises a socket section having a socket-side electrical terminal section that connects to the device-side electrical terminal section,
the device loading section includes a positioning section that aligns the device under test relative to the device loading section prior to the device-side electrical terminal section and the socket-side electrical terminal section contacting each other, and
the optical connector moving section moves the optical connector toward the optical interface of the device under test whose position is set relative to the device loading section.

7. The device interface apparatus according to claim 6, wherein
the device loading section includes an indentation in which at least a portion of the device under test is arranged, and
the positioning section sets the position of the device under test relative to the device loading section by pressing the device under test against a reference surface on an inner wall of the indentation.

8. The device interface apparatus according to claim 6, wherein
the device loading section is movable with respect to the socket section and presses against the socket section while an optical connection is established between the optical interface and the optical connector, and
the socket section connects the socket-side electrical terminal section to the device-side electrical terminal section of the device under test loaded on the device loading section pressing thereagainst.

9. The device interface apparatus according to claim 8, wherein
the device loading section moves away from the socket section when not pressed toward the socket section, due to a spring mechanism provided between the device loading section and the socket section, and moves toward the socket section when pressed toward the socket section.

10. The device interface apparatus according to claim 8, wherein
the optical connector moving section biases the optical connector toward the optical interface in response to the device loading section being pressed toward the socket section.

11. The device interface apparatus according to claim 8, wherein
the optical connector moving section includes a cylinder that moves the optical connector toward the optical interface using gas pressure received from the outside.

12. The device interface apparatus according to claim 6, further comprising:
a substrate having a top surface on which the socket section is provided; and
a flexible optical transmission path that has one end thereof connected to the optical connector and another end thereof fixed to the substrate.

13. A test apparatus that tests a device under test including an optical interface, the test apparatus comprising:
the device interface apparatus according to claim 1 on which the device under test is loaded; and
a testing section that is connected to the device under test via the device interface apparatus and tests the device under test.

14. The test apparatus according to claim 13, wherein
the device under test further includes a device-side electrical terminal section for exchanging electrical signals with the outside,
the device interface apparatus further includes:
a performance board having a socket section with a socket-side electrical terminal section that connects to the device-side electrical terminal section; and
a handler apparatus having a device adhering section that adheres the device under test thereto via suction and an optical connector moving section that adheres the optical connector thereto via suction and moves the optical connector toward the optical interface of the device under test, and
the handler apparatus transports the device loading section, the optical connector, and the optical connector moving section as a group and presses the device under test onto the socket section on the performance board.

15. A method comprising: loading a device under test including an optical interface for transmitting and receiving an optical signal, on a device loading section of a device interface apparatus; and moving an optical connector toward the optical interface of the device under test loaded on the device loading section, to optically connect the optical connector and the optical interface, wherein the device under test includes an optical interface facing a side of device under test, and the moving includes moving the optical connector toward the optical interface in a direction parallel to a device loading surface of the device loading section on which the module under test is loaded.

16. The method according to claim 15, wherein
the device under test further includes a device-side electrical terminal section for exchanging electrical signals with the outside, and
the method further comprises:
connecting a socket-side electrical terminal section of a socket section of the device interface apparatus to the device-side electrical terminal section; and prior to the device-side electrical terminal section and the socket-side electrical terminal section contacting each other, aligning the device under test relative to the device loading section.

17. The method according to claim 16, wherein the connecting is performed after an optical connection is established between the optical interface and the optical connector.

18. The method according to claim 15, further comprising: testing the device under test via the device interface apparatus.

* * * * *